United States Patent
Choi et al.

(10) Patent No.: US 8,330,172 B2
(45) Date of Patent: Dec. 11, 2012

(54) ORGANIC LIGHT EMITTING DIODE DISPLAY AND MANUFACTURING METHOD THEREOF

(75) Inventors: Jin-Baek Choi, Yongin (KR); Ji-Young Choung, Yongin (KR); Joon-Gu Lee, Yongin (KR); Se-Jin Cho, Yongin (KR); Won-Jong Kim, Yongin (KR); Hee-Joo Ko, Yongin (KR); Yeon-Hwa Lee, Yongin (KR); Young-Woo Song, Yongin (KR); Jong-Hyuk Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/180,322

(22) Filed: Jul. 11, 2011

(65) Prior Publication Data
US 2012/0248465 A1    Oct. 4, 2012

(30) Foreign Application Priority Data
Mar. 31, 2011    (KR) .......................... 10-2011-029518

(51) Int. Cl.
*H01L 33/00*    (2010.01)
(52) U.S. Cl. ..................... 257/88; 257/59; 257/E51.018; 438/34; 313/110; 313/112; 313/504; 313/506
(58) Field of Classification Search .................... 257/88, 257/59, E51.018; 438/34; 313/110–113, 313/504–506, 59, 72; 345/76–80
See application file for complete search history.

(56) References Cited

U.S. PATENT DOCUMENTS

| 5,905,548 | A * | 5/1999 | Shimada | 349/38 |
| 6,529,251 | B2 * | 3/2003 | Hibino et al. | 349/42 |
| 7,030,553 | B2 * | 4/2006 | Winters et al. | 313/504 |
| 7,129,634 | B2 * | 10/2006 | Boroson et al. | 313/504 |
| 7,199,516 | B2 * | 4/2007 | Seo et al. | 313/504 |
| 7,605,535 | B2 * | 10/2009 | Kobayashi | 313/506 |
| 7,652,683 | B2 * | 1/2010 | Akagawa et al. | 347/238 |
| 7,807,483 | B2 * | 10/2010 | Yamazaki et al. | 438/29 |
| 7,842,947 | B2 * | 11/2010 | Nakatani et al. | 257/40 |
| 7,939,820 | B2 * | 5/2011 | Kwon | 257/40 |
| 7,948,167 | B2 * | 5/2011 | Chung et al. | 313/504 |
| 7,956,535 | B2 * | 6/2011 | Yanagihara | 313/506 |
| 8,013,341 | B2 * | 9/2011 | Jun et al. | 257/72 |

(Continued)

FOREIGN PATENT DOCUMENTS
KR    10-2004-0104226 A    12/2004
(Continued)

*Primary Examiner* — N Drew Richards
*Assistant Examiner* — Ankush Singal
(74) *Attorney, Agent, or Firm* — Christie, Parker & Hale, LLP

(57) ABSTRACT

An organic light emitting diode display capable of reducing the shortening of image stacking lifetime caused by the residue of the barrier ribs produced during the forming of the barrier ribs is provided. The display includes: a substrate; a first pixel electrode formed on the substrate; barrier ribs formed on the substrate, and having an opening exposing the first pixel electrode; a second pixel electrode formed on the first pixel electrode; an organic light emitting member formed on the second pixel electrode; an organic light emitting member formed on the second pixel electrode; a common electrode formed on the organic light emitting member; and a thin film encapsulation member covering the common electrode. The width of the second pixel electrode is greater than the exposure width of the first pixel electrode exposed through the opening of the barrier ribs.

15 Claims, 6 Drawing Sheets

U.S. PATENT DOCUMENTS

| | | | |
|---|---|---|---|
| 8,058,783 B2 * | 11/2011 | Park et al. | 313/110 |
| 8,143,782 B2 * | 3/2012 | Kim | 313/506 |
| 8,148,894 B2 * | 4/2012 | Park et al. | 313/504 |
| 2003/0080338 A1 * | 5/2003 | Yamazaki et al. | 257/59 |
| 2004/0150761 A1 * | 8/2004 | Wong et al. | 349/43 |
| 2004/0189167 A1 * | 9/2004 | Adachi et al. | 313/112 |
| 2005/0001963 A1 * | 1/2005 | Yokoyama | 349/122 |
| 2005/0046342 A1 * | 3/2005 | Park et al. | 313/504 |
| 2005/0247938 A1 * | 11/2005 | Okamoto et al. | 257/59 |
| 2005/0258441 A1 * | 11/2005 | Shitagami | 257/88 |
| 2006/0012288 A1 * | 1/2006 | Terakado et al. | 313/503 |
| 2006/0028606 A1 * | 2/2006 | Takeguchi et al. | 349/149 |
| 2006/0238119 A1 * | 10/2006 | Spindler | 313/506 |
| 2007/0063645 A1 * | 3/2007 | Yokoyama | 313/506 |
| 2007/0077848 A1 * | 4/2007 | Koo et al. | 445/24 |
| 2007/0102737 A1 * | 5/2007 | Kashiwabara et al. | 257/291 |
| 2007/0120476 A1 * | 5/2007 | Park et al. | 313/506 |
| 2007/0145889 A1 * | 6/2007 | Tamura et al. | 313/504 |
| 2007/0194307 A1 * | 8/2007 | Kim et al. | 257/40 |
| 2007/0290604 A1 * | 12/2007 | Sakanoue et al. | 313/503 |
| 2008/0128686 A1 * | 6/2008 | Kwon | 257/40 |
| 2008/0150434 A1 * | 6/2008 | Sung et al. | 315/169.3 |
| 2008/0180024 A1 * | 7/2008 | Kwon | 313/504 |
| 2008/0185959 A1 * | 8/2008 | Kurauchi | 313/504 |
| 2008/0238295 A1 * | 10/2008 | Takei et al. | 313/499 |
| 2009/0021158 A1 * | 1/2009 | Tanaka et al. | 313/504 |
| 2009/0033596 A1 * | 2/2009 | Yoon et al. | 345/76 |
| 2009/0101911 A1 * | 4/2009 | Kim et al. | 257/66 |
| 2009/0108743 A1 * | 4/2009 | Kobayashi | 313/504 |
| 2009/0128020 A1 * | 5/2009 | Takei et al. | 313/504 |
| 2009/0137074 A1 * | 5/2009 | Lee et al. | 438/29 |
| 2009/0146929 A1 * | 6/2009 | Kim et al. | 345/77 |
| 2009/0170230 A1 * | 7/2009 | Kidu et al. | 438/35 |
| 2009/0174320 A1 * | 7/2009 | Kim | 313/504 |
| 2009/0200922 A1 * | 8/2009 | Lee et al. | 313/504 |
| 2009/0256470 A1 * | 10/2009 | Naono | 313/504 |
| 2009/0261354 A1 * | 10/2009 | Ha et al. | 257/87 |
| 2009/0261715 A1 * | 10/2009 | Sung et al. | 313/504 |
| 2009/0280590 A1 * | 11/2009 | Seo et al. | 438/29 |
| 2010/0019667 A1 * | 1/2010 | Park et al. | 313/504 |
| 2010/0026178 A1 * | 2/2010 | Hwang et al. | 313/506 |
| 2010/0053044 A1 * | 3/2010 | Lee et al. | 345/80 |
| 2010/0066651 A1 * | 3/2010 | Lee et al. | 345/76 |
| 2010/0127266 A1 * | 5/2010 | Saito et al. | 257/59 |
| 2010/0156279 A1 * | 6/2010 | Tamura et al. | 313/504 |
| 2010/0156282 A1 * | 6/2010 | Park et al. | 313/504 |
| 2010/0167435 A1 * | 7/2010 | Bae et al. | 438/23 |
| 2010/0181559 A1 * | 7/2010 | Nakatani et al. | 257/40 |
| 2010/0182552 A1 * | 7/2010 | Park et al. | 349/114 |
| 2010/0193778 A1 * | 8/2010 | An et al. | 257/40 |
| 2010/0238095 A1 * | 9/2010 | Zhang | 345/82 |
| 2011/0057208 A1 * | 3/2011 | Jeon et al. | 257/88 |
| 2011/0095299 A1 * | 4/2011 | Tsuji et al. | 257/72 |
| 2011/0115961 A1 * | 5/2011 | Moriyama et al. | 348/333.01 |
| 2011/0140114 A1 * | 6/2011 | Ko et al. | 257/59 |
| 2011/0156038 A1 * | 6/2011 | Yang et al. | 257/59 |
| 2011/0163330 A1 * | 7/2011 | Kim et al. | 257/88 |
| 2011/0242072 A1 * | 10/2011 | Ota | 345/204 |
| 2012/0001182 A1 * | 1/2012 | Choi et al. | 257/59 |

FOREIGN PATENT DOCUMENTS

| | | |
|---|---|---|
| KR | 10-2008-0054775 A | 6/2008 |
| KR | 10-2009-0061395 A | 6/2009 |

* cited by examiner

ORGANIC LIGHT EMITTING DIODE DISPLAY AND MANUFACTURING METHOD THEREOF

CROSS-REFERENCE TO RELATED APPLICATION

This application claims priority to and the benefit of Korean Patent Application No. 10-2011-0029518, filed in the Korean Intellectual Property Office on Mar. 31, 2011, the entire content of which is incorporated herein by reference.

BACKGROUND

1. Field

Aspects of embodiments of the present invention are directed toward an organic light emitting diode display and a manufacturing method thereof.

2. Description of Related Art

An organic light emitting diode display includes two electrodes and an organic light-emitting layer interposed between the two electrodes. Electrons injected from one of the electrodes and holes injected from the other electrode are combined in the organic light emitting layer to form excitons. The excitons release energy, thereby causing light to be emitted.

A pixel electrode, which is one of the electrodes of the organic light emitting diode display, may be formed of three layers, such as indium tin oxide (ITO)/Ag alloy/indium tin oxide (ITO). In addition, barrier ribs having openings exposing the greater part of the pixel electrode are formed thereon to surround the edge of the pixel electrode.

Since the barrier ribs are formed by photolithography, residue of the barrier ribs remains on the pixel electrode. As a result, current does not uniformly inject into the pixel electrode of the organic light emitting diode display, thereby leading to a reduction in image stacking lifetime. The image stacking lifetime refers to a time period during which images can keep the same picture quality.

Although plasma treatment may be performed to remove by-products of the barrier ribs, plasma treatment using oxygen may cause the Ag alloy constituting the pixel electrode to be deformed. In addition, it is difficult to completely remove the residue of the barrier ribs by plasma treatment using nitrogen. Moreover, the luminous efficiency decreases because the Ag alloy constituting the pixel electrode has a lower reflectivity than pure Ag.

The above information disclosed in this Background section is only for enhancement of understanding of the described embodiments. Therefore, it may contain information that does not form the prior art that is already known in this country to a person of ordinary skill in the art.

SUMMARY

Aspects of embodiment of the present invention are directed toward an organic light emitting diode display and, in particular, to an organic light emitting diode display that improves image stacking lifetime and improves luminous efficiency, and a manufacturing method thereof.

In an exemplary embodiment according to the present invention, an organic light emitting diode display is provided. The organic light emitting diode display includes a substrate, a first pixel electrode on the substrate, barrier ribs on the substrate, a second pixel electrode on the first pixel electrode, an organic light emitting member on the second pixel electrode, a common electrode on the organic light emitting member, and a thin film encapsulation member covering the common electrode. The barrier ribs have an opening exposing the first pixel electrode. A width of the second pixel electrode is greater than an exposure width of the first pixel electrode exposed through the opening of the barrier ribs.

The first pixel electrode may include a first translucent layer, a first metal layer on the first translucent layer, and a second translucent layer on the first metal layer.

The second pixel electrode may include a second metal layer, and a third translucent layer on the second metal layer.

The first metal layer may include silver (Ag), aluminum (Al), platinum (Pt), or a combination thereof. The second metal layer may include silver (Ag).

The first translucent layer, the second translucent layer, and the third translucent layer may include a conductive oxide.

The conductive oxide may include indium tin oxide (ITO), zinc oxide (ZnO), tin oxide ($SnO_2$), ruthenium oxide (RuOx), iridium oxide (IrOx), or a combination thereof.

A thickness of the second metal layer may be between 300 Å and 20000 Å.

A thickness of the third translucent layer may be between 20 Å and 300 Å.

The organic light emitting diode display may further include an adjacent second pixel electrode on an adjacent first pixel electrode. The adjacent second pixel electrode is adjacent to the second pixel electrode. A difference between the width of the second pixel electrode and the exposure width of the first pixel electrode may be less than a distance between the second pixel electrode and the adjacent second pixel electrode.

The second pixel electrode may overlap with edges of the barrier ribs.

According to another exemplary embodiment of the present invention, a manufacturing method of an organic light emitting diode display is provided. The method includes forming a first pixel electrode on a substrate, forming barrier ribs having an opening exposing the first pixel electrode on the substrate, forming a second pixel electrode on the first pixel electrode, forming an organic light emitting member on the second pixel electrode, forming a common electrode on the organic light emitting member, and forming a thin film encapsulation member covering the common electrode. A width of the second pixel electrode is greater than an exposure width of the first pixel electrode exposed through the opening of the barrier ribs.

The forming of the first pixel electrode may include sequentially laminating a first translucent layer, a first metal layer, and a second translucent layer.

The forming of the second pixel electrode may include sequentially laminating a second metal layer and a third translucent layer.

The method may further include forming an adjacent second pixel electrode on an adjacent first pixel electrode. The adjacent second pixel electrode is adjacent to the second pixel electrode. A difference between the width of the second pixel electrode and the exposure width of the first pixel electrode may be less than a distance between the second pixel electrode and the adjacent second pixel electrode.

The forming of the second pixel electrode may include overlapping the second pixel electrode with edges of the barrier ribs.

According to an exemplary embodiment, it is possible to prevent image stacking lifetime from being shortened due to residue of the barrier ribs produced during the formation of the barrier ribs by forming the second pixel electrode with a larger width than the exposure width of the first pixel electrode. Further, the luminous efficiency can be improved because the second metal layer of the second pixel electrode is formed from pure silver (Ag) having a high reflectivity.

DETAILED DESCRIPTION

Figure 1:
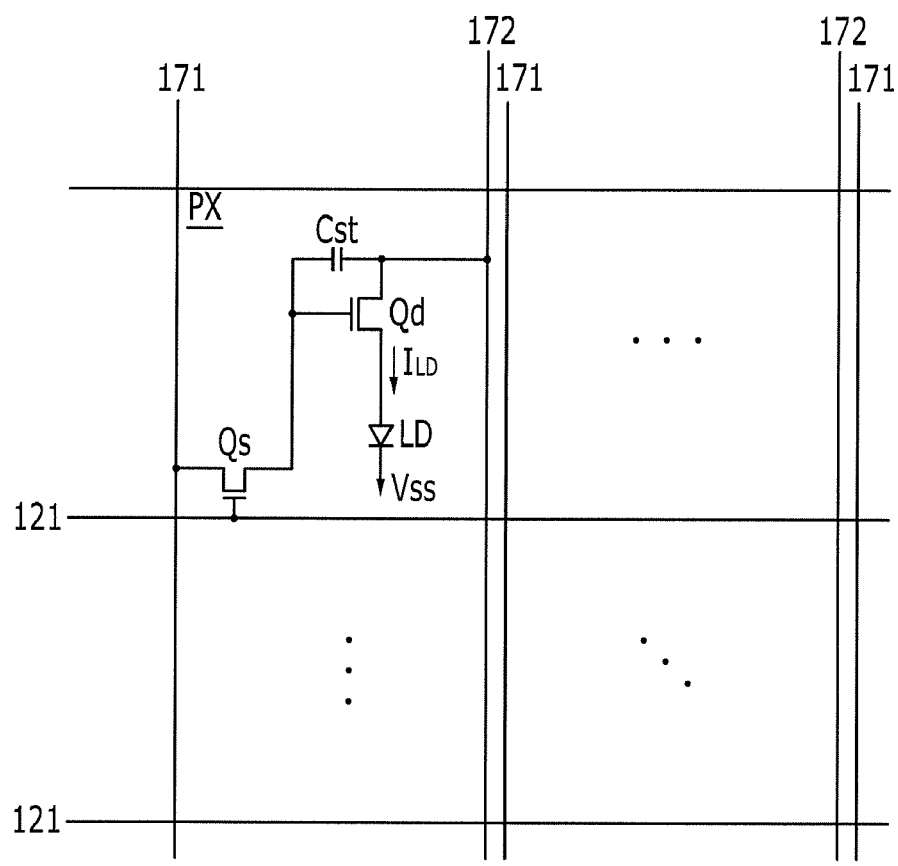
FIG. 1 is an equivalent circuit diagram of an organic light emitting diode display according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In order to clarify the description of the disclosed embodiments, elements extrinsic to their description are omitted. Further, like reference numerals refer to like elements throughout the application. In addition, the sizes and thicknesses of the elements in the drawings are not necessarily to scale, but rather for better understanding and ease of description. The present invention is not limited thereto.

An organic light emitting diode display according to an exemplary embodiment will now be described in detail with reference to FIG. 1 and FIG. 2.

FIG. 1 is an equivalent circuit diagram of an organic light emitting diode display according to an exemplary embodiment. FIG. 2 is a cross-sectional view of an organic light emitting diode display according to an exemplary embodiment.

As shown in FIG. 1, the organic light emitting diode display includes a plurality of signal lines 121, 171, and 172 and a plurality of pixels PX connected thereto and arranged substantially in a matrix. The signal lines 121, 171, and 172 include a plurality of gate lines 121 for transmitting gate signals (or scan signals), a plurality of data lines 171 for transmitting data signals, and a plurality of driving voltage lines 172 for transmitting driving voltages. The gate lines 121 extend substantially in a row direction and are substantially parallel to each other, while the data lines 171 and the driving voltage lines 172 extend substantially in a column direction and are substantially parallel to each other.

Each pixel PX includes a switching thin film transistor Qs, a driving thin film transistor Qd, a storage capacitor Cst, and an organic light emitting diode (OLED) LD. The switching transistor Qs has a control terminal coupled to one of the gate lines 121, an input terminal coupled to one of the data lines 171, and an output terminal coupled to the driving transistor Qd. The switching transistor Qs transmits the data signals applied to the data line 171 to the driving transistor Qd in response to the scan signal applied to the gate line 121.

The driving transistor Qd has a control terminal coupled to the switching transistor Qs, an input terminal coupled to the driving signal line 172, and an output terminal coupled to the organic light emitting diode LD. The driving transistor Qd drives an output current $I_{LD}$ having a magnitude that varies according to the voltage between the control terminal and the input terminal.

The capacitor Cst is coupled between the control terminal and the input terminal of the driving transistor Qd. The capacitor Cst stores the data signal applied to the control terminal of the driving transistor Qd and sustains it after the switching transistor Qs is turned off.

The organic light emitting diode LD includes an anode connected to the output terminal of the driving transistor Qd and a cathode connected to a common voltage Vss. The organic light emitting diode LD displays images by emitting light with different intensities according to the output current $I_{LD}$ of the driving transistor Qd.

In FIG. 1, the switching transistor Qs and the driving transistor Qd are n-channel field effect transistors FETs. However, in other embodiments, at least one of the switching transistor Qs or the driving transistor Qd may be a p-channel field effect transistor. In addition, in other embodiments, the interconnection between the transistors Qs and Qd, the storage capacitor Cst, and the organic light emitting diode LD may be different from what is shown.

The detailed structure of the organic light emitting diode display shown in FIG. 1 will now be described with reference to FIG. 2.

Figure 2:
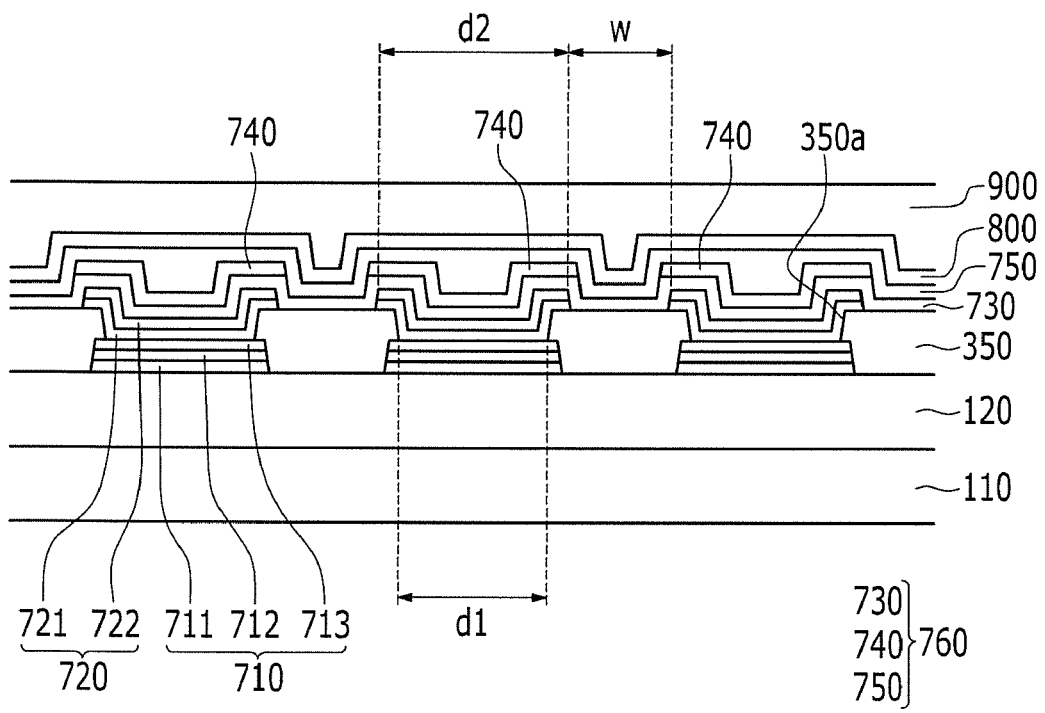
FIG. 2 is a cross-sectional view of an organic light emitting diode display according to an exemplary embodiment.

As shown in FIG. 2, a thin film transistor layer 120 having thin film transistors including the switching thin film transistor Qs and the driving thin film transistor Qd is formed on a substrate 110. A first pixel electrode 710 corresponding to an anode is formed on the thin film transistor layer 120. The output terminal of the driving thin film transistor Qd is connected to the first pixel electrode 710. The first pixel electrode 710 includes a first translucent layer 711, a first metal layer 712, and a second translucent layer 713.

The first translucent layer 711 may be made of a transparent conductive oxide. The transparent conductive oxide may be made of, for example, indium tin oxide (ITO), zinc oxide (ZnO), tin oxide ($SnO_2$), ruthenium oxide (RuOx), iridium oxide (IrOx), or a combination thereof.

The first metal layer 712 may be formed from a metal having reflective properties. For example, the first metal layer 712 may be made of a low resistance metal such as silver (Ag), aluminum (Al), platinum (Pt), or a combination thereof, with a thickness of about 20 Å to 250 Å.

The second translucent layer 713 may be made of a transparent conductive oxide. The transparent conductive oxide may be made of, for example, indium tin oxide (ITO), zinc oxide (ZnO), tin oxide ($SnO_2$), ruthenium oxide (RuOx), iridium oxide (IrOx), or a combination thereof.

Barrier ribs 350 are formed on the thin film transistor layer 120, surrounding the edges of the first pixel electrode 710. The barrier ribs 350 define openings 350a exposing the greater part of the first pixel electrode 710 by surrounding the edges of the first pixel electrode 710.

A second pixel electrode 720 is formed on the edges of the first pixel electrode 710 and the barrier ribs 350. The second pixel electrode 720 overlaps with the edges of the barrier ribs 350.

The second pixel electrode 720 includes a second metal layer 721 and a third translucent layer 722 which are sequentially laminated. The second metal layer 721 may be formed from silver (Ag) having a high reflectivity. Thus, higher reflectivity leads to higher luminous efficiency.

The second metal layer 721 may be formed with a thickness of 300 Å to 20000 Å. If the thickness of the second metal layer 721 is less than 300 Å, the reflectivity may lower below acceptable levels. If the thickness of the second metal layer 721 is greater than 20000 Å, the processing time and the manufacturing costs may increase above acceptable levels. The third translucent layer 722 may be made of a transparent conductive oxide. The transparent conductive oxide may be made of, for example, Indium tin oxide (ITO), zinc oxide (ZnO), tin oxide ($SnO_2$), ruthenium oxide (RuOx), iridium oxide (IrOx), or a combination thereof.

The third translucent layer 722 may be formed with a thickness of 20 Å to 300 Å. If the thickness of the third translucent layer 722 is less than 20 Å, it may be difficult to protect the second metal layer 721 from the outside. If the thickness of the third translucent layer 722 is greater than 300 Å, the third translucent layer 722 may absorb excessive outside light.

In FIG. 2, the width d2 of the second pixel electrode 720 is greater than the exposure width d1 of the first pixel electrode 710 exposed through the openings 350a of the barrier ribs 350. By forming the second pixel electrode 720 with a larger width d2 than the exposure width d1 of the first pixel electrode 710, it is possible to prevent image stacking lifetime from being shortened due to residue of the barrier ribs 350 produced during the formation of the barrier ribs 350. Accordingly, current uniformly injects into the second pixel electrode 720 formed on the first pixel electrode 710, and the second pixel electrode 720 having a larger width d2 than the exposure width d1 of the first pixel electrode 710 allows for a higher aperture ratio, resulting in a lower current density. Thus, the image stacking lifetime is not reduced.

Moreover, in FIG. 2, half of the difference between the width d2 of the second pixel electrode 720 and the exposure width d1 of the first pixel electrode 710 is less than half of the distance w between two adjacent second pixel electrodes 720 (that is, the difference between the width d2 of the second pixel electrode 720 and the exposure width d1 of the first pixel electrode 710 is less than the distance w between two adjacent second pixel electrodes 720). If half of the difference between the width d2 of the second pixel electrode 720 and the exposure width d1 of the first pixel electrode 710 is greater than or equal to half of the distance w between two adjacent second pixel electrodes 720, the two adjacent second pixel electrodes 720 may short circuit with each other.

An organic light emitting member 760 is formed on the second pixel electrode 720. The organic light emitting member 760 may include an organic light emitting layer (EML) 740 for emitting light and supplementary layers 730 and 750 for improving the luminous efficiency of the organic light emitting layer 740. The additional layers 730 and 750 may include a hole supplementary layer 730 including a hole injection layer (HIL) and a hole transporting layer (HTL) and an electron supplementary layer 750 including an electron transport layer (ETL) and an electron injection layer (EIL). In this case, the hole supplementary layer 730, the organic light emitting layer 740, and the electron supplementary layer 750 are sequentially laminated on the second pixel electrode 720.

A common electrode 800 corresponding to a cathode is formed on the organic light emitting member 760. The common electrode 800 is made of an MgAg alloy. The common electrode 800 is formed on the entire surface of the substrate, and together with the first pixel electrode 710 and the second pixel electrode 720 causes the current to flow to the organic light emitting member 760.

The first pixel electrode 710 and the second pixel electrode 720 may form a microcavity structure together with the common electrode 800. The microcavity structure refers to a structure in which light is repeatedly reflected between a reflective layer and a translucent layer that are spaced apart by an optical length to amplify light of a particular wavelength through constructive interference. In the present exemplary embodiment, the first pixel electrode 710 and the second pixel electrode 720 may serve as reflective layers, and the common electrode 800 may serve as a translucent layer. The optical length of each pixel may be controlled by changing the distance between the first pixel electrode 710, the second pixel electrode 720, and the common electrode 800.

The first pixel electrode 710 and the second pixel electrode 720 considerably modify the illumination characteristics of light emitted by the organic light emitting member 760. Of the modified light, light near the wavelength corresponding to a resonance wavelength of the microcavity is strengthened by the common electrode 800 and emitted toward the common electrode 800, and light of other wavelengths is suppressed.

A thin film encapsulation member 900 for covering and encapsulating the common electrode 800 is formed on the common electrode 800.

Figure 3:
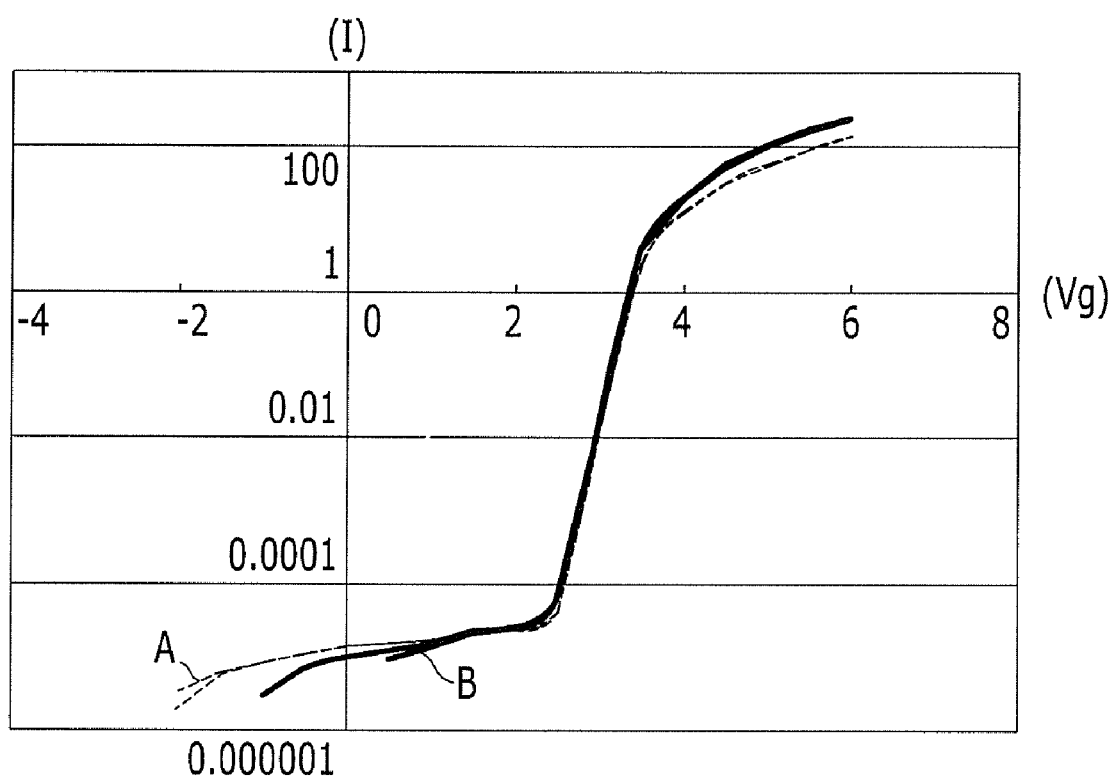
FIG. 3 is a graph of current versus driving voltage, which shows a comparison between a comparative example and an exemplary embodiment.
Figure 4:
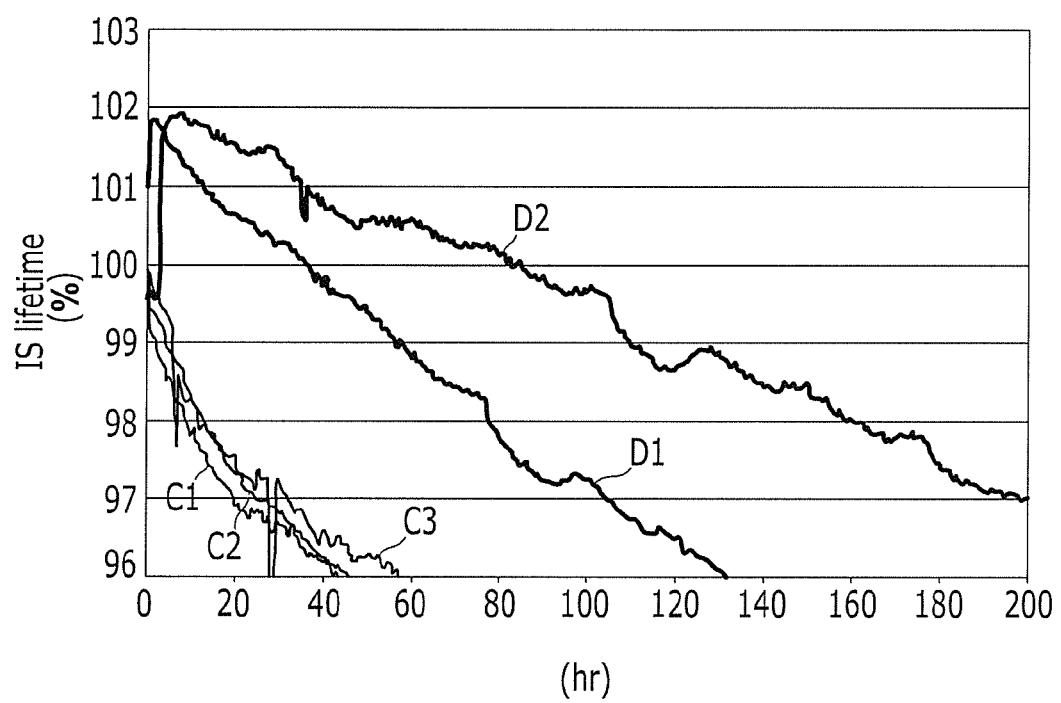
FIG. 4 is a graph of image stacking lifetime, which shows a comparison between a comparative example and an exemplary embodiment.

FIG. 3 is a graph of current versus driving voltage, which shows a comparison between a comparative example and an exemplary embodiment. FIG. 4 is a graph of image stacking lifetime, which shows a comparison between a comparative example and the exemplary embodiment.

As shown in FIG. 3, a driving current curve B changing with the driving voltage of the organic light emitting diode display according to an exemplary embodiment, which includes the first pixel electrode 710 and the second pixel electrode 720, does not decline substantially. On the contrary, curve B is almost similar to a curve A of the driving current I changing with the driving voltage Vg of the organic light emitting diode display of a comparative example, which only includes the first pixel electrode 710. Accordingly, the exemplary embodiment has comparable current versus driving voltage performance when compared to that of a comparative embodiment.

Moreover, as shown in FIG. 4, the image stacking (IS) lifetime is about 25 hours on average when lifetime curves C1, C2, and C3 for the organic light emitting diode display of a comparative example reach 97%. However, in an exemplary embodiment, the image stacking (IS) lifetime increases to 104 hours and 200 hours, respectively, when lifetime curves D1 and D2 for the organic light emitting diode display according to the exemplary embodiment reach 97%.

A manufacturing method of an organic light emitting diode display according to an exemplary embodiment will be described in detail hereinafter with reference to FIGS. 5 to 7.

Figure 5:
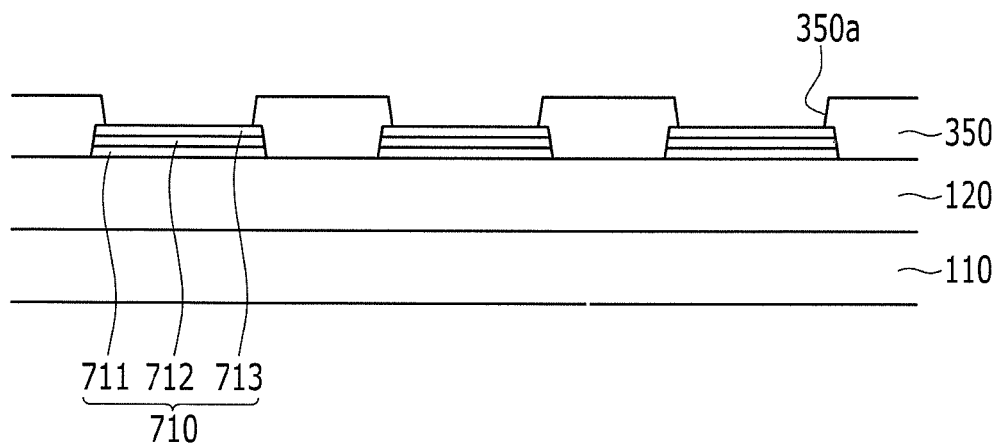
FIG. 5 to FIG. 7 are cross-sectional views sequentially illustrating a manufacturing method of an organic light emitting diode display according to an exemplary embodiment.
Figure 6:
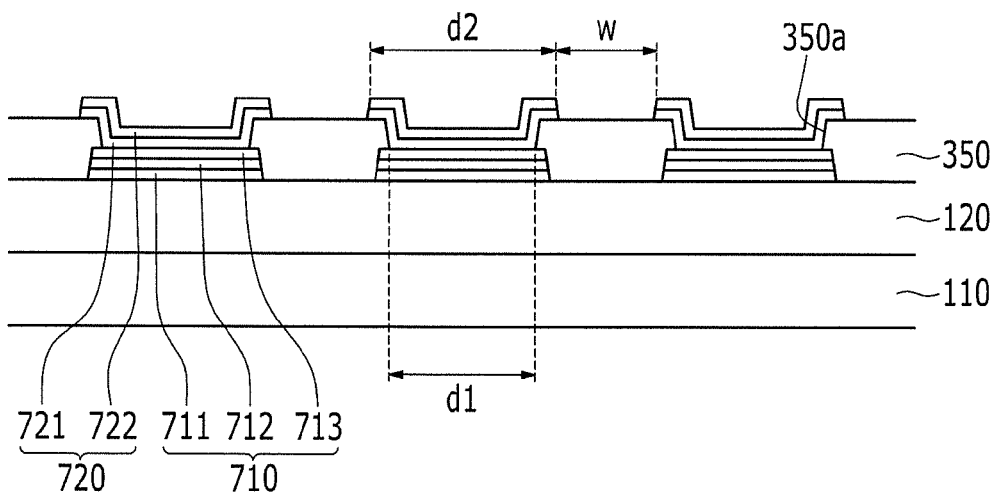
Figure 7:
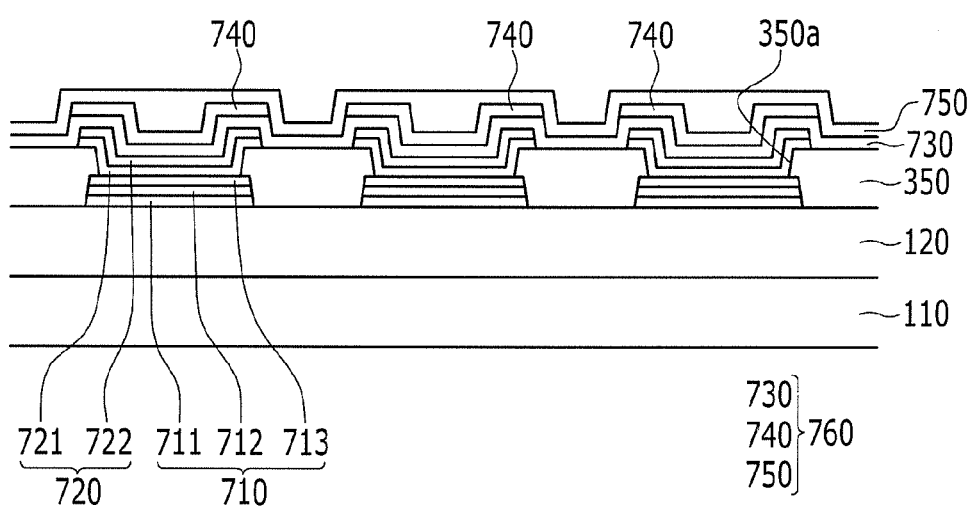

FIG. 5 to FIG. 7 are cross-sectional views sequentially illustrating a manufacturing method of an organic light emitting diode display according to an exemplary embodiment.

As shown in FIG. 5, a thin film transistor layer 120 including a switching thin film transistor Qs and a driving thin film transistor Qd is first formed on a substrate 110. A first pixel electrode 710 is formed on the thin film transistor layer 120. The first pixel electrode 710 is formed by sequentially laminating a first translucent layer 711, a first metal layer 712, and a second translucent layer 713. The first translucent layer 711 may be made of a transparent conductive oxide, the first metal layer 712 may be formed from a metal having reflective properties, and the second translucent layer 713 may be made of a transparent conductive oxide. In addition, barrier ribs 350 having openings 350a exposing the greater part of the first pixel electrode 710 are formed on the thin film transistor layer 120 to surround the edges (or periphery) of the first pixel electrode 710.

Next, as shown in FIG. 6, the second pixel electrode 720 is formed on the edges of the first pixel electrode 710 and the barrier ribs 350. The second pixel electrode 720 is formed by sequentially laminating the second metal layer 721 and the third translucent layer 722. In this case, the second metal layer 721 may be formed from pure silver (Ag) having a high reflectivity in order to improve luminous efficiency, and the third translucent layer 722 may be made of a transparent conductive oxide. The second metal layer 721 may be formed by thermal evaporation, and the third translucent layer 722 may be formed by sputtering.

In addition, the width d2 of the second pixel electrode 720 is greater than the exposure width d1 of the first pixel electrode 710 exposed through the openings 350*a* of the barrier ribs 350. Accordingly, it is possible to prevent image stacking lifetime from being shortened due to residue of the barrier ribs 350 produced during the formation of the barrier ribs 350.

Moreover, half of the difference between the width d2 of the second pixel electrode 720 and the exposure width d1 of the first pixel electrode 710 is less than half of the distance w between two adjacent second pixel electrodes 720 (that is, the difference between the width d2 of the second pixel electrode 720 and the exposure width d1 of the first pixel electrode 710 is less than the distance w between two adjacent second pixel electrodes 720). If half of the difference between the width d2 of the second pixel electrode 720 and the exposure width d1 of the first pixel electrode 710 is greater than or equal to half of the distance w between two adjacent second pixel electrodes 720, the two adjacent second pixel electrodes 720 may short circuit with each other.

Next, as shown in FIG. 7, an organic light emitting member 760 is formed on the second pixel electrode 720. The organic light emitting member 760 is formed by sequentially laminating a hole supplementary layer 730, an organic light emitting layer 740, and an electron supplementary layer 750. Continuing with FIG. 2, a common electrode 800 is formed on the organic light emitting member 760, and a thin film encapsulation member 900 is formed on the common electrode 800.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and equivalents thereof.

| Description of selected symbols | |
|---|---|
| 110: substrate | 120: thin film transistor layer |
| 350: barrier ribs | 350a: openings (in barrier ribs) |
| 710: first pixel electrode | 720: second pixel electrode |
| 760: organic light emitting member | 800: common electrode |
| 900: thin film encapsulation member | |

What is claimed is:

1. An organic light emitting diode display comprising:
   a substrate;
   a first pixel electrode on the substrate;
   barrier ribs on the substrate, having an opening exposing the first pixel electrode;
   a second pixel electrode on the first pixel electrode;
   an organic light emitting member on the second pixel electrode;
   a common electrode on the organic light emitting member; and
   a thin film encapsulation member covering the common electrode,
   wherein a width of the second pixel electrode is greater than an exposure width of the first pixel electrode exposed through the opening of the barrier ribs.

2. The organic light emitting diode display of claim 1, wherein the first pixel electrode comprises:
   a first translucent layer;
   a first metal layer on the first translucent layer; and
   a second translucent layer on the first metal layer.

3. The organic light emitting diode display of claim 1, further comprising an adjacent second pixel electrode on an adjacent first pixel electrode, the adjacent second pixel electrode being adjacent to the second pixel electrode, wherein a difference between the width of the second pixel electrode and the exposure width of the first pixel electrode is less than a distance between the second pixel electrode and the adjacent second pixel electrode.

4. The organic light emitting diode display of claim 1, wherein the second pixel electrode overlaps with edges of the barrier ribs.

5. The organic light emitting diode display of claim 2, wherein the second pixel electrode comprises:
   a second metal layer; and
   a third translucent layer on the second metal layer.

6. The organic light emitting diode display of claim 5, wherein
   the first metal layer comprises silver (Ag), aluminum (Al), platinum (Pt), or a combination thereof, and
   the second metal layer comprises silver (Ag).

7. The organic light emitting diode display of claim 5, wherein the first translucent layer, the second translucent layer, and the third translucent layer comprise a conductive oxide.

8. The organic light emitting diode display of claim 5, wherein a thickness of the second metal layer is between 300 Å and 20000 Å.

9. The organic light emitting diode display of claim 5, wherein a thickness of the third translucent layer is between 20 Å and 300 Å.

10. The organic light emitting diode display of claim 7, wherein the conductive oxide comprises indium tin oxide (ITO), zinc oxide (ZnO), tin oxide ($SnO_2$), ruthenium oxide (RuOx), iridium oxide (IrOx), or a combination thereof.

11. A manufacturing method of an organic light emitting diode display, the method comprising:
   forming a first pixel electrode on a substrate;
   forming barrier ribs having an opening exposing the first pixel electrode on the substrate;
   forming a second pixel electrode on the first pixel electrode;
   forming an organic light emitting member on the second pixel electrode;
   forming a common electrode on the organic light emitting member; and
   forming a thin film encapsulation member covering the common electrode,
   wherein a width of the second pixel electrode is greater than an exposure width of the first pixel electrode exposed through the opening of the barrier ribs.

12. The method of claim 11, wherein the forming of the first pixel electrode comprises sequentially laminating a first translucent layer, a first metal layer, and a second translucent layer.

13. The method of claim 11, wherein the forming of the second pixel electrode comprises sequentially laminating a second metal layer and a third translucent layer.

14. The method of claim 11, further comprising forming an adjacent second pixel electrode on an adjacent first pixel electrode, the adjacent second pixel electrode being adjacent to the second pixel electrode, wherein a difference between the width of the second pixel electrode and the exposure width of the first pixel electrode is less than a distance between the second pixel electrode and the adjacent second pixel electrode.

15. The method of claim 11, wherein the forming of the second pixel electrode comprises overlapping the second pixel electrode with edges of the barrier ribs.

* * * * *